(12) United States Patent
Dong et al.

(10) Patent No.: US 9,895,860 B2
(45) Date of Patent: Feb. 20, 2018

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tingze Dong, Beijing (CN); Dongsheng Huang, Beijing (CN); Qian Zhang, Beijing (CN); Peiqiang Guan, Beijing (CN); Yujia Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 92 days.

(21) Appl. No.: 14/889,105

(22) PCT Filed: May 6, 2015

(86) PCT No.: PCT/CN2015/078359
§ 371 (c)(1),
(2) Date: Nov. 4, 2015

(87) PCT Pub. No.: WO2016/086591
PCT Pub. Date: Jun. 9, 2016

(65) Prior Publication Data
US 2016/0339667 A1  Nov. 24, 2016

(30) Foreign Application Priority Data
Dec. 3, 2014  (CN) .......................... 2014 1 0725063

(51) Int. Cl.
*B32B 3/10* (2006.01)
*B32B 3/26* (2006.01)
(Continued)

(52) U.S. Cl.
CPC ................ *B32B 3/26* (2013.01); *B32B 15/04* (2013.01); *B32B 27/06* (2013.01); *G02F 1/1339* (2013.01);
(Continued)

(58) Field of Classification Search
None
See application file for complete search history.

(56) References Cited

U.S. PATENT DOCUMENTS

2008/0186572 A1* 8/2008 Tomikawa ......... G02B 27/2214
359/462
2011/0037713 A1* 2/2011 Chen ...................... G06F 3/041
345/173
2011/0242743 A1  10/2011 Moon

FOREIGN PATENT DOCUMENTS

CN  102208312 A  10/2011
CN  102208572 A  10/2011
(Continued)

OTHER PUBLICATIONS

Machine translation of JP 2002328375 Retrieved on Apr. 2, 2017.*
(Continued)

*Primary Examiner* — Christopher Polley
(74) *Attorney, Agent, or Firm* — Harness, Dickey & Pierce, P.L.C.

(57) ABSTRACT

The present disclosure provides a display panel and a display device. The display panel includes a first substrate and a second substrate opposite to each other. A sealant is arranged on one of inner surfaces of the first substrate and the second substrate, and a first spacer is arranged between
(Continued)

the sealant and the other one of the inner surfaces of the first substrate and the second substrate.

20 Claims, 1 Drawing Sheet

(51) Int. Cl.
    *G02F 1/1339*     (2006.01)
    *B32B 15/04*     (2006.01)
    *B32B 27/06*     (2006.01)
    *H01L 51/52*     (2006.01)
    *H01J 9/26*     (2006.01)
    *H01J 9/24*     (2006.01)
    *B32B 3/08*     (2006.01)

(52) U.S. Cl.
    CPC ............ *H01J 9/261* (2013.01); *H01L 51/524* (2013.01); *B32B 3/08* (2013.01); *B32B 2250/40* (2013.01); *B32B 2307/42* (2013.01); *B32B 2307/732* (2013.01); *B32B 2457/20* (2013.01); *H01J 9/242* (2013.01)

(56) References Cited

FOREIGN PATENT DOCUMENTS

| | | | |
|---|---|---|---|
| CN | 102253521 | A | 11/2011 |
| CN | 102622117 | A | 8/2012 |
| CN | 203241663 | U | 10/2013 |
| CN | 102253521 | B | 11/2013 |
| CN | 104360545 | A | 2/2015 |
| CN | 204203591 | U | 3/2015 |
| JP | 2001343654 | A | 12/2001 |
| JP | 2002328375 | A * | 11/2002 |
| JP | 2002328375 | A | 11/2002 |
| JP | 2008233721 | A | 10/2008 |

OTHER PUBLICATIONS

First Office Action regarding Chinese application No. 201410725063.3, dated Aug. 24, 2016. Translation provided by Dragon Intellectual Property Law Firm.
Written Opinion of the International Searching Authority for international application No. PCT/CN2015/078359.

* cited by examiner

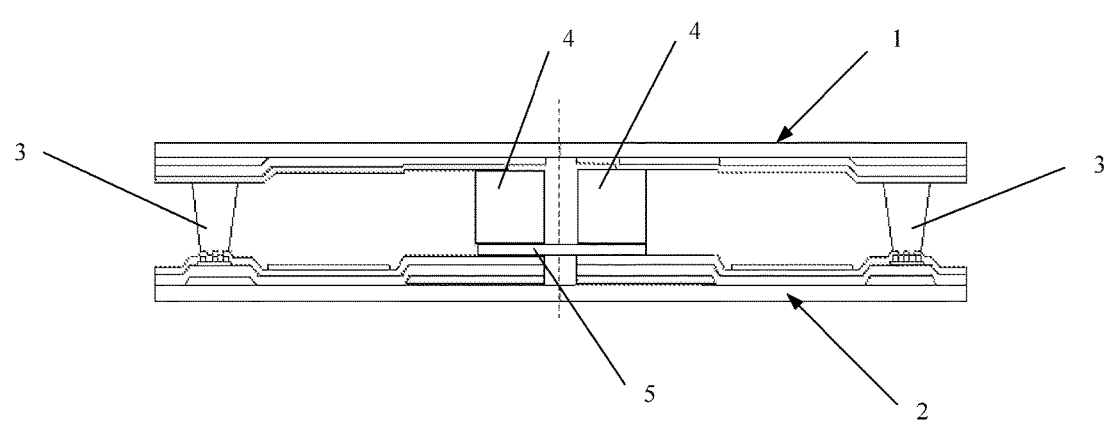

DISPLAY PANEL AND DISPLAY DEVICE

CROSS-REFERENCE TO RELATED APPLICATIONS

This application is the U.S. National Phase of PCT Application No. PCT/CN2015/078359, filed on May 6, 2015, which claims priority to the Chinese Patent Application No. 201410725063.3, filed on Dec. 3, 2014, the disclosures of which are incorporated in their entirety by reference herein.

TECHNICAL FIELD

The present disclosure relates to the field of display technology, in particular to a display panel and a display device.

BACKGROUND

Narrow bezel can be used to effectively increase a display area and thereby to achieve a super-wide display screen and bright about a better visual impact, so it has attracted more and more attentions by many manufacturers. More and more cell phones and laptops each with a narrow bezel are being made available in the market, and the narrow bezel has become a tendency for the mobile display. Therefore, a bezel design is becoming more and more important, and there is an urgent need in the display industry to provide a narrower bezel.

Currently, for a panel design, an array substrate and a color filter substrate are oppositely arranged to form a cell via a sealant filled with Si-Balls. In this way, when the cell together with the sealant is cut so as to provide a narrow bezel, it is very difficult to cut through the sealant directly. In addition, metal lines may be pressed and damaged by the Si-Balls.

SUMMARY

An object of the present disclosure is to provide a display panel and a display device, so as to improve a yield.

In one aspect, the present disclosure provides in one embodiment a display panel, including a first substrate and a second substrate opposite to each other. A sealant is arranged on one of inner surfaces of the first substrate and the second substrate, and a first spacer is arranged between the sealant and the other one of the inner surfaces of the first substrate and the second substrate.

Alternatively, a plurality of first spacers is arranged on the inner surfaces of the first substrate or the second substrate.

Alternatively, the plurality of first spacers is arranged on the sealant at a predetermined interval.

Alternatively, the first spacer is arranged on the inner surface of the first substrate, the first substrate is a color filter substrate, and the first spacer is arranged on the inner surface of the color filter substrate at an identical layer to a second spacer.

Alternatively, a thickness of the second spacer in a direction perpendicular to the first substrate is equal to a sum of a thickness of the sealant in the direction perpendicular to the first substrate and a thickness of the first spacer in the direction perpendicular to the first substrate.

Alternatively, the first spacer and the second spacer are made of an identical material.

Alternatively, the first spacer is arranged on the inner surface of the first substrate, the first substrate is an array substrate, and the first spacer is arranged on the inner surface of the array substrate at an identical layer to a third spacer.

Alternatively, a thickness of the third spacer in a direction perpendicular to the first substrate is equal to a sum of a thickness of the sealant in the direction perpendicular to the first substrate and a thickness of the first spacer in the direction perpendicular to the first substrate.

Alternatively, the first spacer and the third spacer are made of an identical material.

Alternatively, the first spacer is made of resin or metal.

Alternatively, the first spacer is of a solid or hollowed-out structure.

In another aspect, the present disclosure provides in one embodiment a display device including the above-mentioned display panel.

According to the embodiments of the present disclosure, a part of the sealant doped with Si-Balls in the related art is replaced with the first spacer, so as to prevent metal lines from being damaged when cutting the display panel together with the sealant, reduce the amount of the Si-Balls and facilitate the cutting, thereby to provide a narrow bezel in a better manner.

BRIEF DESCRIPTION OF THE DRAWINGS

FIG. 1 is a schematic view showing a display panel according to one embodiment of the present disclosure.

DETAILED DESCRIPTION

The present disclosure will be described hereinafter in details in conjunction with the drawings and embodiments. The following embodiments are for illustrative purposes only, but shall not be used to limit the scope of the present disclosure.

As shown in FIG. 1, the present disclosure provides in one embodiment a display panel, which includes a first substrate 1 and a second substrate 2 opposite to each other. A sealant 5 is arranged on one of inner surfaces of the first substrate 1 and the second substrate 2, and a first spacer 4 is arranged between the sealant 5 and the other one of the inner surfaces of the first substrate 1 and the second substrate 2.

According to the display panel in the embodiment of the present disclosure, a part of the sealant doped with Si-Balls in the related art is replaced with the first spacer, so as to prevent metal lines from being damaged when cutting the display panel together with the sealant, reduce the amount of Si-Balls and facilitate the cutting, thereby to provide a narrow bezel in a better manner.

Alternatively, a plurality of the first spacers is arranged on the inner surface of the first substrate 1 or the second substrate 2. Furthermore, the plurality of the first spacers is arranged on the sealant at a predetermined interval. For example, as shown in FIG. 1, a dotted line represents a cutting line for the display panel. The two first spacers 4 are arranged at both sides of the cutting line, respectively, at the predetermined interval, i.e., the sealant 5 is not covered completely by the first spacer 4, so as to reduce the resistance caused when cutting, thereby to facilitate the cutting and prevent the metal lines corresponding to a location of the sealant from being damaged.

Alternatively, the first spacer 4 is arranged on the inner surface of the first substrate 1. The first substrate 1 is a color filter substrate, and it is arranged on the inner surface of the color filter substrate at an identical layer to a second spacer 3, so as to simplify the manufacture process. To further simplify the manufacture process, the first spacer 4 and the second spacer 3 on the inner surface of the color filter substrate are made of an identical material. In this way, it is able to conveniently and quickly form the first spacer 4 and the second spacer 5 simultaneously by merely using a mask plate suitable for the display panel in the embodiment of the present disclosure.

It should be noted that, the first spacer 4 may be made of resin or metal according to the practical need.

Alternatively, the first spacer 4 is of a solid or hollowed-out structure.

Alternatively, in order to guarantee a uniform gap between the first substrate 1 and the second substrate 2, a thickness of the second spacer 3 in a direction perpendicular to the first substrate 1 is equal to a sum of a thickness of the sealant 5 in the direction perpendicular to the first substrate 1 and a thickness of the first spacer 4 in the direction perpendicular to the first substrate 1.

Alternatively, the first spacer 4 may be arranged on the inner surface of the color filter substrate or an array substrate. When the first spacer 4 is arranged on the inner surface of the array substrate, the first spacer 4 is arranged at an identical layer to a third spacer on the inner surface of the array substrate (the third spacer is of an identical function, and arranged at an identical location, to the second spacer), so as to simplify the manufacture process. In order to further simplify the manufacture process, the first spacer and the third spacer on the inner surface of the array substrate are made of an identical material. In this way, it is able to conveniently and quickly form the first spacer and the third spacer simultaneously by merely using a mask plate suitable for the display panel in the embodiment of the present disclosure.

It should be noted that, the first spacer may be made of resin or metal according to the practical need.

Alternatively, the first spacer 4 is of a solid or hollowed-out structure.

Furthermore, in order to guarantee a uniform gap between the first substrate 1 and the second substrate 2, a thickness of the third spacer in the direction perpendicular to the first substrate is equal to a sum of a thickness of the sealant in the direction perpendicular to the first substrate and a thickness of the first spacer in the direction perpendicular to the first substrate.

The present disclosure further provides in one embodiment a display device including the above-mentioned display panel.

The thickness of the first spacer may be determined according to the practical need, as long as it may also function as to support the substrates like a part of the sealant doped with Si-Balls in the related art. As a result, it is able to reduce the amount of the Si-Balls, facilitate the cutting and prevent the metal lines from being damaged during the cutting.

The above are merely the preferred embodiments of the present disclosure. It should be noted that, those skilled in the art may make further improvements and modifications without departing from the principle of the present disclosure, and these improvements and modifications shall also fall within the scope of the present disclosure.

What is claimed is:

1. A display panel, comprising a first substrate and a second substrate opposite to each other, wherein a sealant is arranged on an inner surface of the second substrate, and a first spacer is arranged on the sealant between the sealant and an inner surface of the first substrate.

2. The display panel according to claim 1, wherein a plurality of first spacers are arranged on the inner surface of the first substrate.

3. The display panel according to claim 2, wherein the plurality of first spacers are arranged on the sealant at a predetermined interval.

4. The display panel according to claim 1, wherein the first spacer is arranged on the inner surface of the first substrate, the first substrate is a color filter substrate, and the first spacer is arranged on the inner surface of the color filter substrate at an identical layer to a second spacer.

5. The display panel according to claim 4, wherein a thickness of the second spacer in a direction perpendicular from the inner surface of the first substrate is equal to a sum of a thickness of the sealant in the direction perpendicular from the inner surface of the first substrate and a thickness of the first spacer in the direction perpendicular from the inner surface of the first substrate.

6. The display panel according to claim 4, wherein the first spacer and the second spacer are made of an identical material.

7. The display panel according to claim 1, wherein the first spacer is arranged on the inner surface of the first substrate, the first substrate is an array substrate, and the first spacer is arranged on the inner surface of the array substrate at an identical layer to a third spacer.

8. The display panel according to claim 7, wherein a thickness of the third spacer in a direction perpendicular from the inner surface of the first substrate is equal to a sum of a thickness of the sealant in the direction perpendicular from the inner surface of the first substrate and a thickness of the first spacer in the direction perpendicular from the inner surface of the first substrate.

9. The display panel according to claim 7, wherein the first spacer and the third spacer are made of an identical material.

10. The display panel according to claim 1, wherein the first spacer is made of resin or metal.

11. The display panel according to claim 1, wherein the first spacer is of a solid or hollowed-out structure.

12. A display device, comprising the display panel according to claim 1.

13. The display panel according to claim 5, wherein the first spacer and the second spacer are made of an identical material.

14. The display panel according to claim 8, wherein the first spacer and the third spacer are made of an identical material.

15. The display panel according to claim 2, wherein the first spacer is made of resin or metal.

16. The display panel according to claim 3, wherein the first spacer is made of resin or metal.

17. The display panel according to claim 4, wherein the first spacer is made of resin or metal.

18. The display panel according to claim 2, wherein the first spacer is of a solid or hollowed-out structure.

19. The display panel according to claim 3, wherein the first spacer is of a solid or hollowed-out structure.

20. The display panel according to claim 4, wherein the first spacer is of a solid or hollowed-out structure.

* * * * *